United States Patent [19]

Lau et al.

[11] Patent Number: 5,825,084
[45] Date of Patent: Oct. 20, 1998

[54] SINGLE-CORE TWO-SIDE SUBSTRATE WITH U-STRIP AND CO-PLANAR SIGNAL TRACES, AND POWER AND GROUND PLANES THROUGH SPLIT-WRAP-AROUND (SWA) OR SPLIT-VIA-CONNECTIONS (SVC) FOR PACKAGING IC DEVICES

[75] Inventors: John H. Lau, Palo Alto; Yung Shih Chen, San Jose; Tai-Yu Chou, Pleasanto; Frank H. Wu, Sunnyvale; Kuan Luen Chen, San Jose; Wei H. Koh, Irvine, all of Calif.

[73] Assignee: Express Packaging Systems, Inc., Palo Alto, Calif.

[21] Appl. No.: 795,478

[22] Filed: Feb. 11, 1997

Related U.S. Application Data

[60] Provisional application No. 60/024,641 Aug. 22, 1996.

[51] Int. Cl.⁶ .......................... H01L 23/12; H01L 23/50; H01L 23/28
[52] U.S. Cl. .......................... 257/700; 257/666; 257/691; 257/692; 257/696; 257/698
[58] Field of Search ................................. 257/700, 707, 257/712, 717, 720, 675, 690–693, 666, 648, 724, 735, 696, 680; 174/52.4, 255, 260; 361/744, 785, 792

[56] References Cited

U.S. PATENT DOCUMENTS

| | | | |
|---|---|---|---|
| 4,638,348 | 1/1987 | Brown et al. | 257/700 |
| 5,006,792 | 4/1991 | Malhi et al. | 257/691 |
| 5,672,909 | 9/1997 | Glenn et al. | 257/700 |

FOREIGN PATENT DOCUMENTS

| | | | |
|---|---|---|---|
| 58-225654 | 12/1983 | Japan | 257/690 |
| 60-22348 | 2/1985 | Japan | 257/724 |
| 63-232342 | 9/1988 | Japan | 257/690 |
| 1-171255 | 2/1989 | Japan | 257/643 |
| 2-198158 | 8/1990 | Japan | 257/700 |
| 4-48756 | 2/1992 | Japan | 257/700 |
| 4-56152 | 2/1992 | Japan | 257/700 |
| 5-82646 | 4/1993 | Japan | 257/700 |
| 5-125405 | 7/1993 | Japan | 257/690 |

Primary Examiner—Tom Thomas
Assistant Examiner—Alexander Oscar Williams
Attorney, Agent, or Firm—Bo-In Lin

[57] ABSTRACT

The present invention discloses a new substrate with two metal layer circuit structure and layout for semiconductor packaging. The speed and performance characteristics of the semiconductor device are optimized while the packaging structure is simplified by utilizing only one dielectric layer and conventional printed circuit board fabrication process. The difficulties encountered due to the complexities and higher cost of production required for the multiple layer and high density configuration are thus avoided. The improved circuit structure is achieved by implementing a segmented ring on one side of a substrate and a split plane on the other side thus forming a single layer substrate structure. The edges of the substrate are coated with metal layer to provide inter-layer connections. In addition to the benefits of high performance, low cost, the improved circuit structure and package layout provide flexibility allowing higher degree of freedom for selecting the location and number of input and output signal lines and connections to the ground and power planes from the semiconductor device.

22 Claims, 10 Drawing Sheets

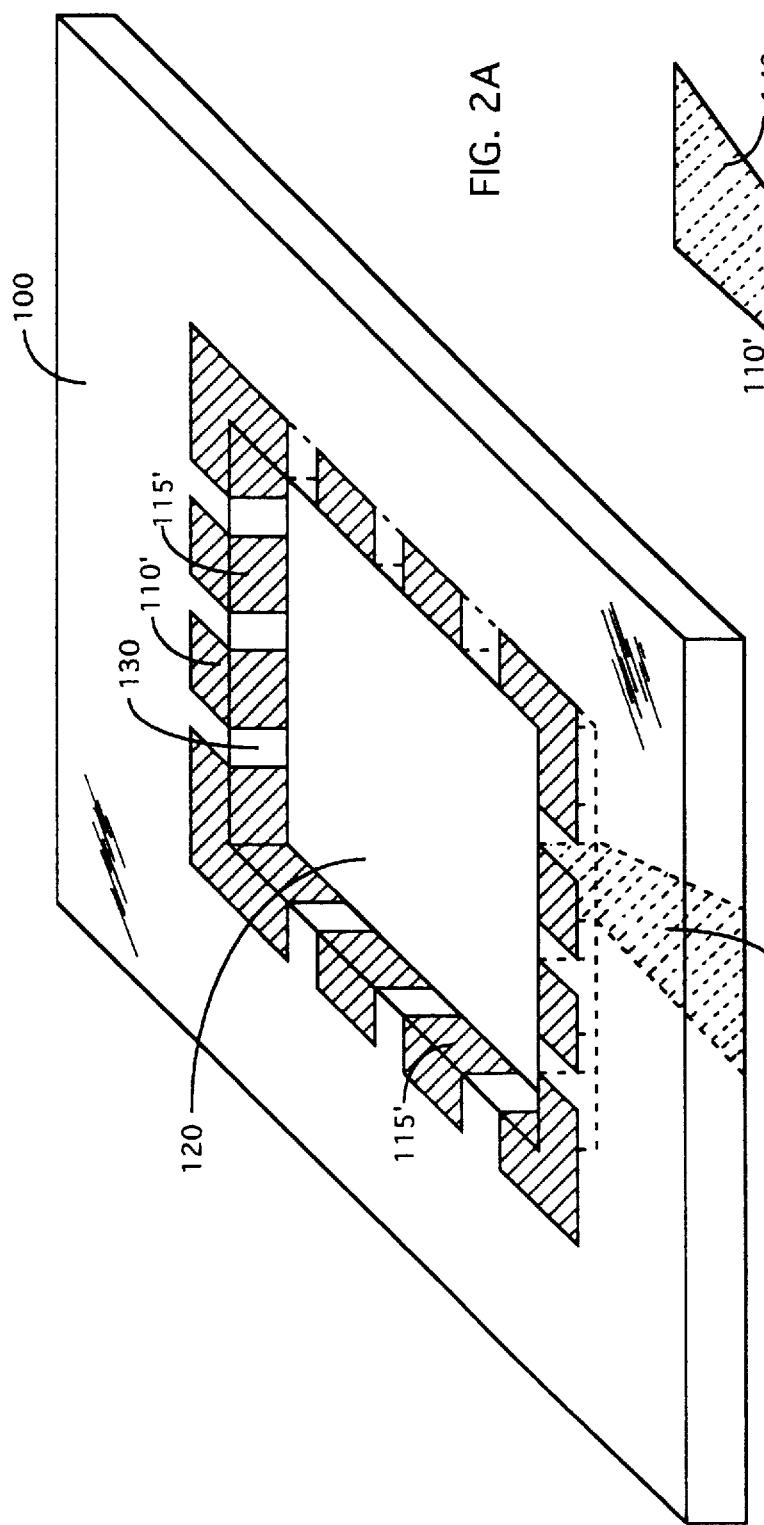
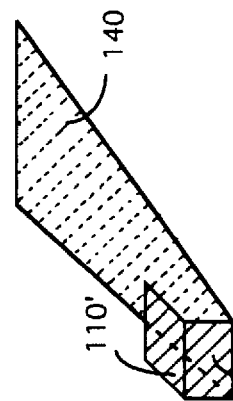
FIG. 2A
FIG. 2B

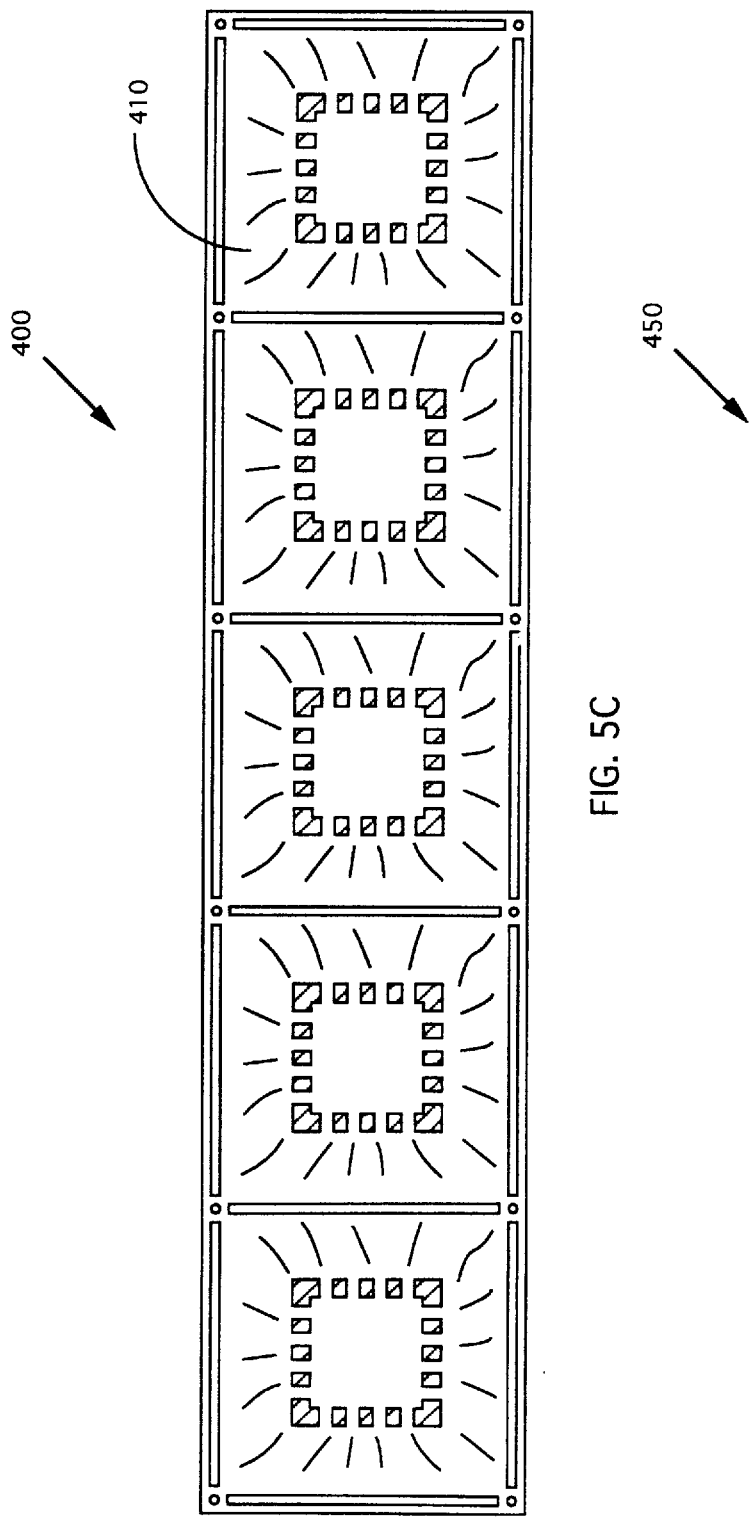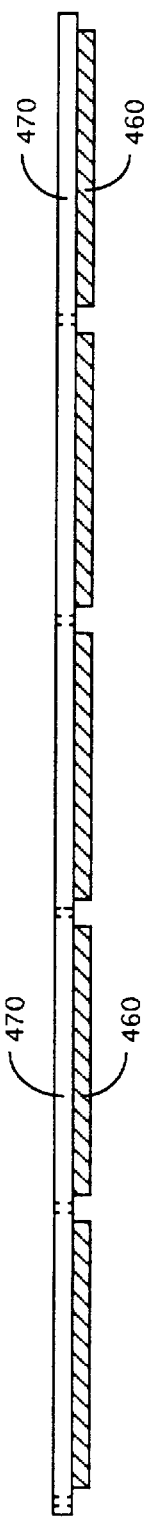
FIG. 5C
FIG. 5D

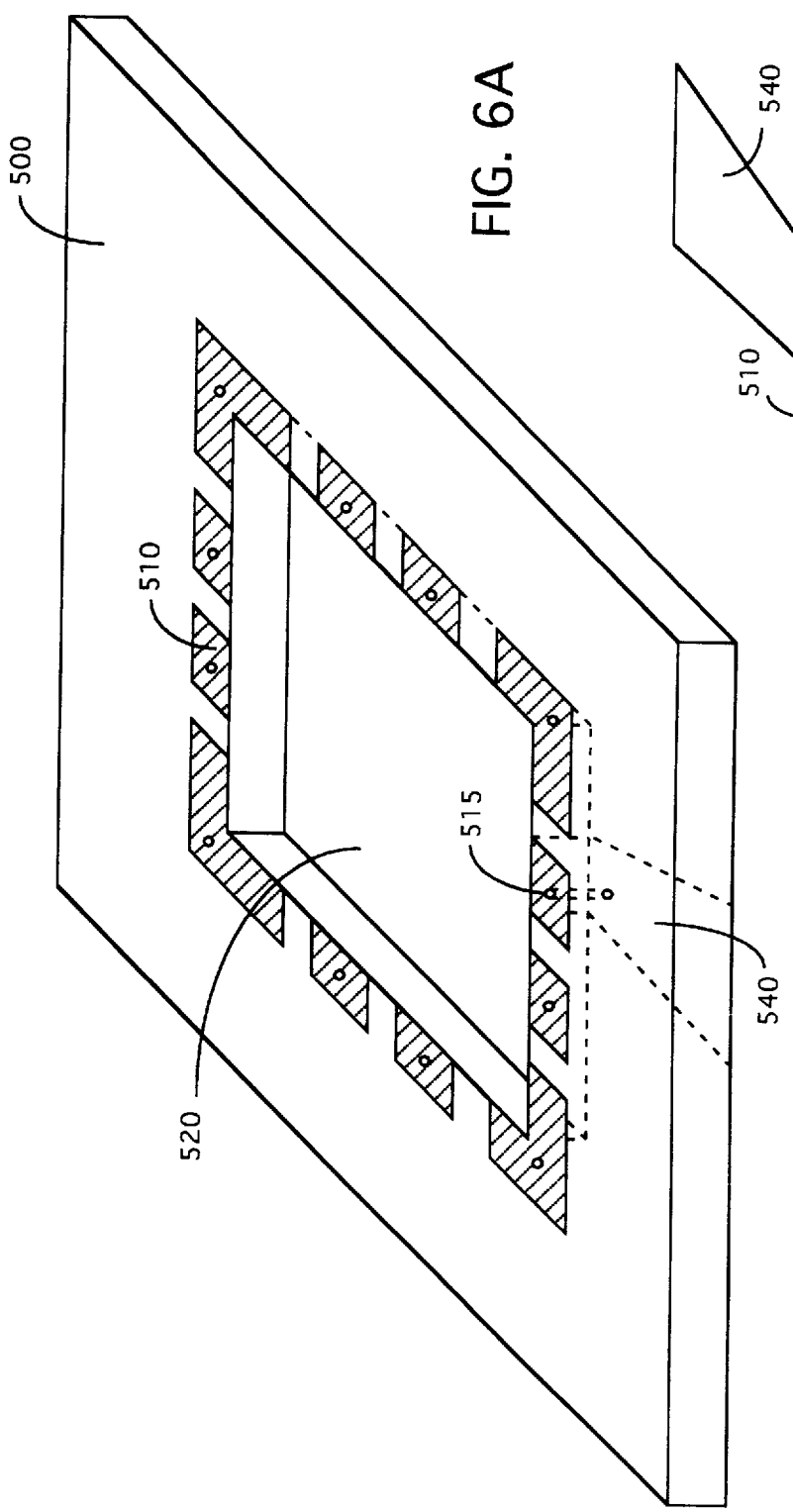

SINGLE-CORE TWO-SIDE SUBSTRATE WITH U-STRIP AND CO-PLANAR SIGNAL TRACES, AND POWER AND GROUND PLANES THROUGH SPLIT-WRAP-AROUND (SWA) OR SPLIT-VIA-CONNECTIONS (SVC) FOR PACKAGING IC DEVICES

This Application claims a Priority Filing Date of Aug. 22, 1996 benefited from a previously filed Provisional Application 60/024,641.

BACKGROUND OF THE INVENTION

1. Field of the Invention

This invention relates generally to the electronic package. More particularly, this invention relates to the substrate structure and manufacture method for improving circuit connection with ring-shaped power and ground contact segments connected to split contact planes via split-wrap-around (SWA) connections for semiconductor device packages.

2. Description of the Prior Art

Modern technology of packaging the integrated circuit (IC) devices is limited by the additional costs required in applying a complicated multiple layer structure for manufacturing the substrate. As the number of layer are increased, the processes of punching through holes, the placement of metal traces and wires to different layers, and the arrangement of connecting different signals to wires in different layer all become more complicate. Production costs for packaging are increased while productivity and yield are decreased due to these complexities. On the other hand, the high performance requirements of modem IC devices impose high density of interconnections and large number of input and output signal lines for the IC devices to be packaged into ever smaller volume. All these design and performance considerations add to the difficulties in attempting to lower the production costs which are increasing due to the use of a multiple-layer substrate with complicate structures.

Modern semiconductor packages typically includes a substrate to mount an integrated circuit (IC) chip thereon. The areas on the surface of the substrate next to the mounted chip are then applied to redistribute or fan out the input and output signals from the IC device. The substrate can be a metal, e.g., copper lead-frame, a laminated epoxy glass, or a ceramic plate. Polymeric encapsulants or plastic molding compounds are used to seal off the device. As the clock speed increases to several hundred megahertz or higher, the speed of signal redistribution impacted by the packaging configurations often becomes a limiting design factor of device performance. Conventional electrical circuit design and packaging technology may no longer be adequate to satisfy the high speed signal transmission requirements. For high speed high performance devices, in order to overcome these limitations, there is a demand for improved circuit design and packaging techniques where the signal redistribution processes can be more rapidly and reliably carried out with less electrical noises.

A technique to improve the signal redistribution from the semiconductor device is to form two rings, i.e., a power ring and a ground ring, for wire connection, as that shown in FIGS. 1A and 1B. A top view and a cross sectional view for a conventional substrate 10 applied to package a semiconductor are shown in FIGS. 1A and 1B respectively. Two rings, i.e., a ground ring 30 and a power ring 35, are formed on the substrate 10 surrounding the semiconductor device 20 disposed in the cut-off section 25 (see FIG. 1B). A plurality of conductive wires 40 are interconnected between the semiconductor device 20 and the ground ring 30 and the power ring 35 for connection to a ground voltage or a high voltage. The substrate 10 is attached to a heat sink plate 15 which supports a semiconductor device 20 placed in a cut-off section 25 disposed in a center portion of the substrate 10. A plurality of signal wires 45 are connected to a corresponding contact pad 50 disposed on the substrate 10 and are further connected to a ball 60 via a metal trace 55 formed on the top surface of the substrate 10. The ground ring 30 and the power ring 35 are connected to a ground plane 65 and a power plane 70 respectively formed beneath the bottom surface of the substrate 10 through a ground via-connection via 75 and a power via connection 80 respectively punched through the substrate 10. The ground plane 65 and the power plane 70 are then interconnected to the balls 60 through another set of via-connections 85 disposed near the peripheral of the substrate 10.

The technique as discussed above is to achieve high performance by forming a multiple layer substrate, including the separate ground plane 65 and power plane 70, to increase the interconnection density with higher number of signal traces. Finer metal traces are then applied with smaller spacing between them. Additional through-holes, e.g., via connections 75, 80 and 85, are required to be formed on the substrate for connecting the traces to several layers. The processes required to make a substrate of multiple layer structure and forming a plurality of via-connections cause significant increase in complexity of manufacturing processes and higher production cost for the IC packages.

Therefore, a need still exits in the art to provide an improved substrate structure to reduce the manufacture complexities such that the difficulties faced by those of ordinary skill in the art may be overcome. The improved substrate structure and method of manufacture provided for packaging the IC device must still meet the high performance requirements of speed and interconnection densities for the IC device. While the enhanced technique must enable those of ordinary skill in the art to simplify the substrate structure such that the production cost of the IC package can be reduced.

SUMMARY OF THE PRESENT INVENTION

It is therefore an object of the present invention to provide a new structure and method of manufacture for employing a single-layer substrate to overcome the aforementioned difficulties encountered in the prior art.

Specifically, it is an object of the present invention to provide a new structure and method of manufacture for a single-layer substrate wherein a plurality of mutually insulated contact-segments for power and ground connections are provided with split contact planes disposed on the bottom surface of the single layer substrate whereby a single layer substrate can be utilized while still maintaining high performance characteristics which are achievable previously only through multiple layer substrate in the prior art.

Another object of the present invention is to provide a method of manufacture for a single-layer substrate wherein the single layer substrate includes split ground and power planes such that the structure complexities and the manufacture costs are reduced.

Another object of the present invention is to provide a new substrate structure and method of manufacture for a single-layer substrate wherein an IC designer is provided with more flexibility of selecting number and locations of ground and power connections to the mutually insulated contact pad segments such that more optimal layout design and lower manufacture cost can be more conveniently achieved.

Another object of the present invention is to provide a new substrate structure and method of manufacture for a single-layer substrate wherein the insulation between the contact pads and wires is improved and by arranging alternating ground and power contact pads, lower noises caused by coupling and interference are reduced.

Briefly, in a preferred embodiment, the present invention comprises a semiconductor packaging assembly. The packaging assembly includes a single layer, double-sided printed circuit board substrate suitable for application for semiconductor and electronic packages provided to satisfy the performance requirements of low noises and high clock speed. Specifically, novel processing steps are applied to manufacture a plurality of mutually insulated contact-pad segments shaped as split ring employed for ground and power connections to the semiconductor device. Each of the mutually insulated contact-pad segments are further formed to be in electric contact with split contact planes via a split-wrap-around connections formed as a thin conductive layer for wrapping around an edge surface cut off between the top and bottom surfaces of the substrate. Each of the contact planes which is formed as a conductive layer on the bottom surface can be ether a power or ground contact plane depending on the voltage level of the split contact-pad segments. Thus a two-sided single-layer substrate provided with ground and power contact segment and contact planes is formed. The substrate has a simplified structure. The cost of production and the reliability of electrical connections are improved. A user is also provided with more flexibility to select a ground or power contact pads depending on the layout of signal input or output ports on the semiconductor device.

These and other objects and advantages of the present invention will no doubt become obvious to those of ordinary skill in the art after having read the following detailed description of the preferred embodiment which is illustrated in the various drawing figures.

BRIEF DESCRIPTION OF THE DRAWINGS

FIGS. 2A is perspective view of a substrate including a plurality of mutually insulated contact-pad segments of this invention manufactured according to the method described in FIGS. 3A to 3D or FIGS. 4A to 4C below;

FIG. 2B is a perspective view of a split wrap around (SWA) connection in electrical contact with a contact pad segment of FIG. 2A;

FIG. 5C shows a rigid strip of PCB sheet for manufacturing several substrates in a streamline process flow or in parallel to increase the productivity for producing the substrate of this invention;

FIG. 5D shows a cross sectional view of a strip of PCB sheet for manufacturing several substrates which includes a heat-spreader sheet attached to the bottom surface wherein the manufacture processes can be arranged in streamline or in parallel to increase the productivity for producing the substrate of this invention;

FIG. 6A is perspective view of a substrate including a plurality of mutually insulated contact-pad segments of this invention; and FIG. 6B is a perspective view of a via-connection for connecting the mutually insulated contact segments on the top surface of the substrate to the split contact planes on the bottom surface for a substrate of the present invention.

DETAILED DESCRIPTION OF THE PREFERRED EMBODIMENT

Figure 1A:
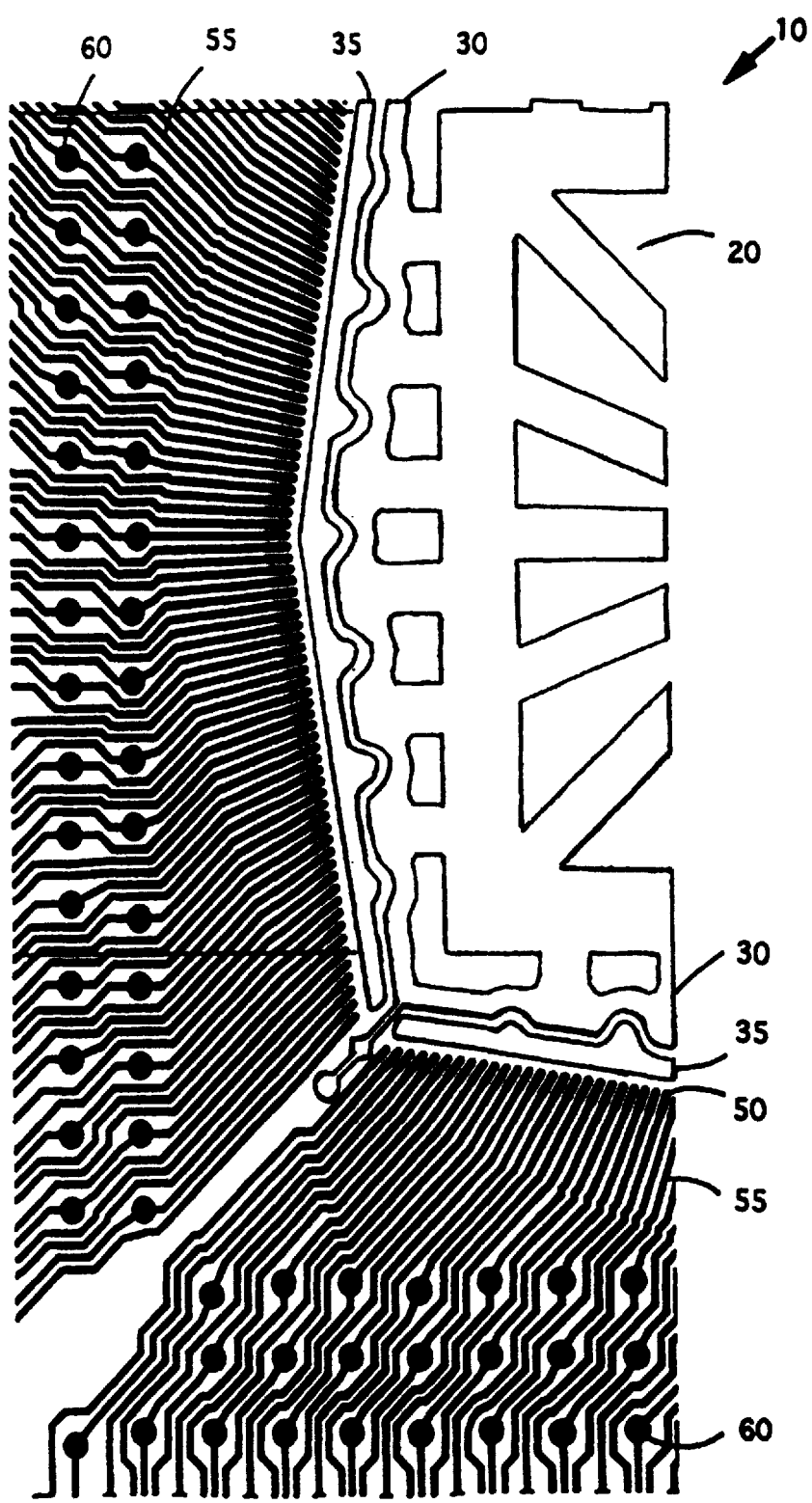
FIGS. 1A and 1B show a partial top view and a cross sectional view respectively for a prior art package assembly for packaging a semiconductor device therein with wires connected to a printed circuit board substrate which includes a separate ground ring and a power ring for connecting to a multiple contact planes formed in a multiple layer structure PCB substrate.
Figure 1B:
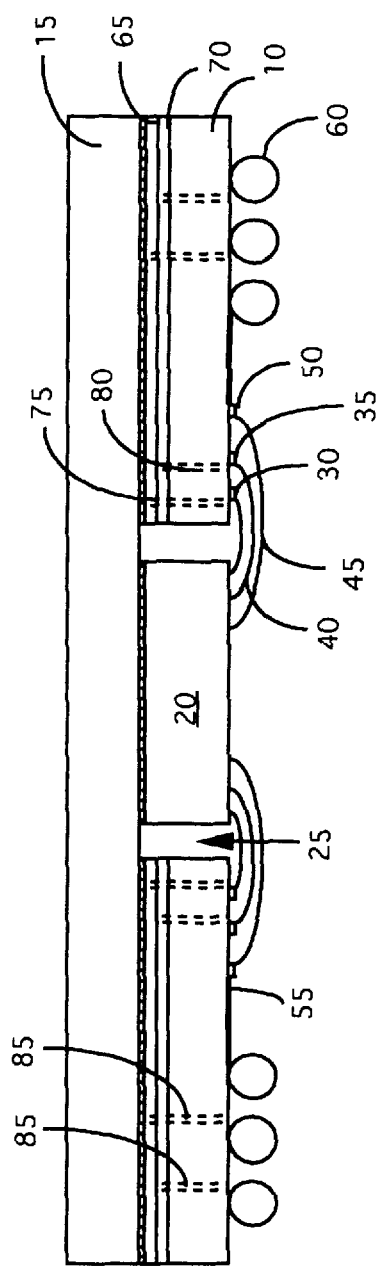

Referring to FIG. 2A for the perspective view of a substrate 100 of the present invention. A central portion 120 is cut off to provide a cavity for disposing an integrated circuit (IC) device (not shown) therein. The substrate further includes a plurality of mutually insulated contact-pad segment 110'. Each of these segments 110' is in contact with a split wrap around (SWA) connection 115' which wraps around the edge of the central cavity 120 for connecting the contact pad segments 110' to a split contact plane 140 disposed on the bottom surface of the substrate 100 (see FIG. 2B). Each of these SWA connection 115' wrapping around the edges of the central cavity 120 is separated from a neighboring connection 115' by a separation edge area 130. Each of the contact-pad segments 110' together with the SWA connections 115' and the corresponding split contact planes 140 can be employed as a power or ground contact plane to provide necessary ground or power voltages depending on the layout and design features of the IC device to be disposed in the central cut off cavity 120 to provide an IC package utilizing this novel substrate 100.

Figure 2C:
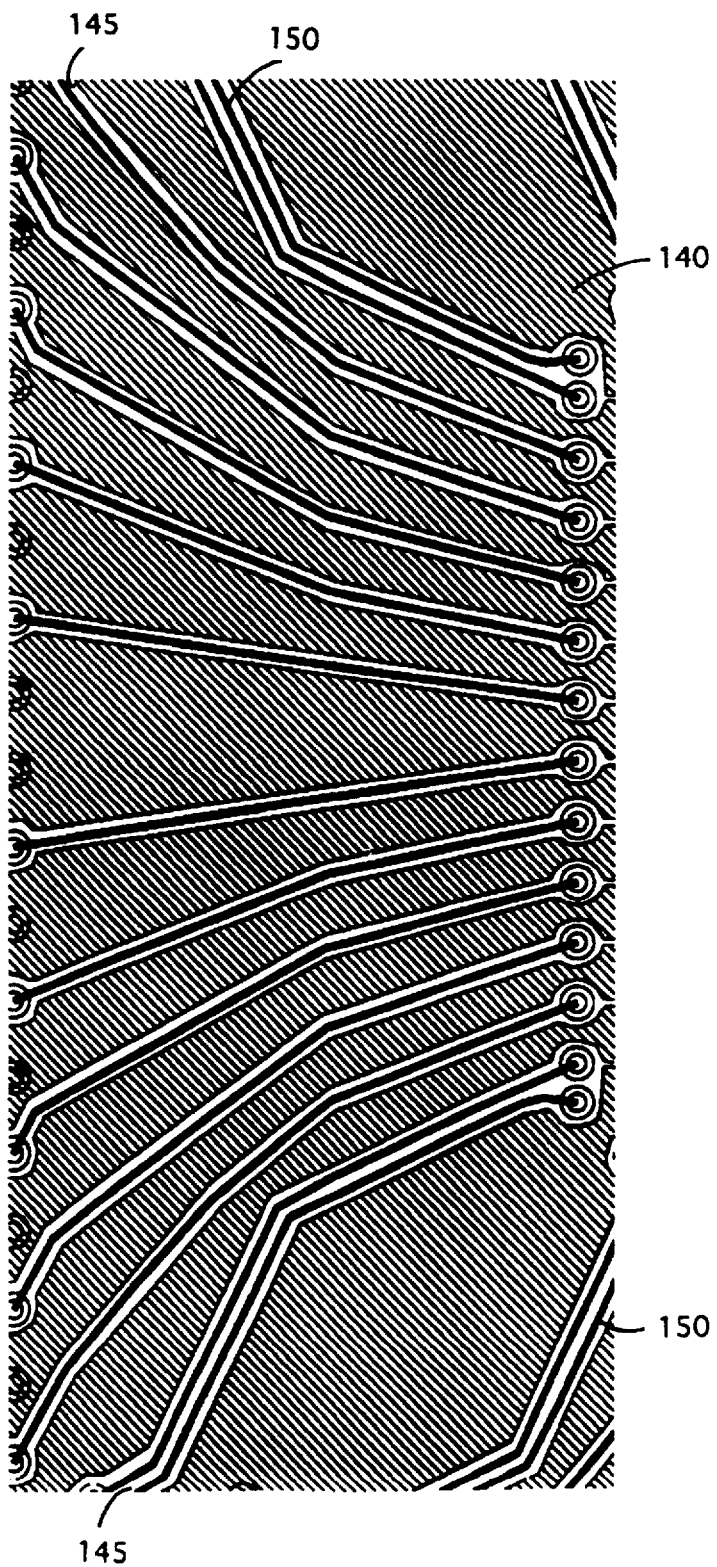
FIG. 2C is a partial bottom view of the substrate of FIG. 2A which includes a plurality of ground and power planes.

FIG. 2C shows a bottom view of the substrate 100 where the bottom surface is coated with a plurality of split planes 140 which are mutually insulated from each other and each split contact plane is in electrical contact with a SWA connection 115' thus each split contact plane is also in electrical contact with a mutually insulated contact pad segment 110'. Since these split contact planes are mutually insulated and separated by separating gaps 145. The signal wire density on the top surface can be further reduced by making use of these separating gaps to form conductive traces 150 therein. The conductive traces are connected to the signal contact pads on the top surface with via-connections punched through the substrate 100.

Referring to FIG. 2C again for the configuration of the coplanar signal metal traces 150 disposed on the bottom surface of the substrate 100. The coplanar signal metal traces 150 are now configured to be adjacent to and coplanar with the split contact planes 140 and some of the contact planes 140 are at a ground voltages. Since these coplanar signal metal traces 150 are now better isolated from neighboring signal coplanar signal metal traces 150 by the split contact planes 140, there are less cross coupling effects with better isolation and de-coupling. The switching noises generated from cross talks between the signal lines 150 and the neighboring signal lines 150 are reduced. Additionally, the signal transmission lines formed on the top surface of the substrate 100 (which are not shown for the sake of simplicity for illustration) are also benefited by the split contact planes 140 formed on the bottom surface because some of these split contact planes 140 are connected to a ground voltage. The cross talks and coupling interference between the coplanar transmission lines 150 on the bottom surface and between the signal transmission lines disposed on the top surface (not shown) are reduced with good isolation and de-coupling effects provided by the ground voltage from some of the split contact planes 140 disposed on the bottom surface of the substrate 100.

Figure 3A:
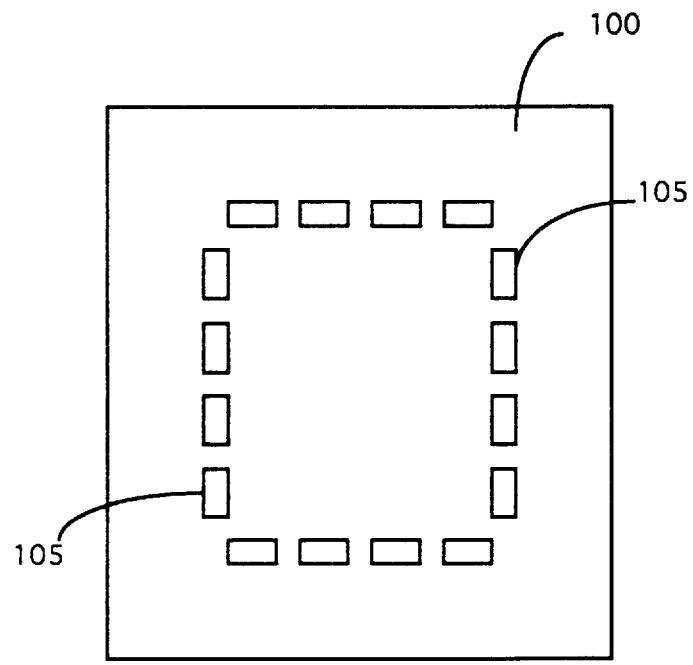
FIGS. 3A to 3D show the processing steps for manufacturing the substrate of the present invention.
Figure 3B:
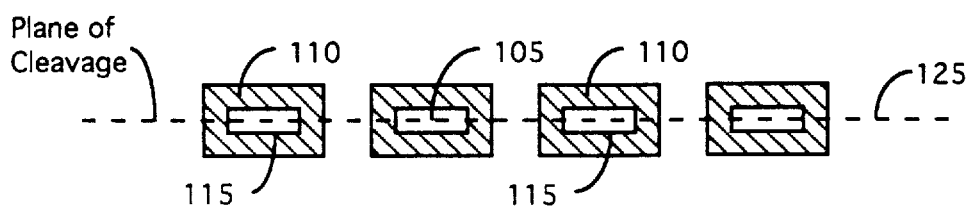
Figure 3C:
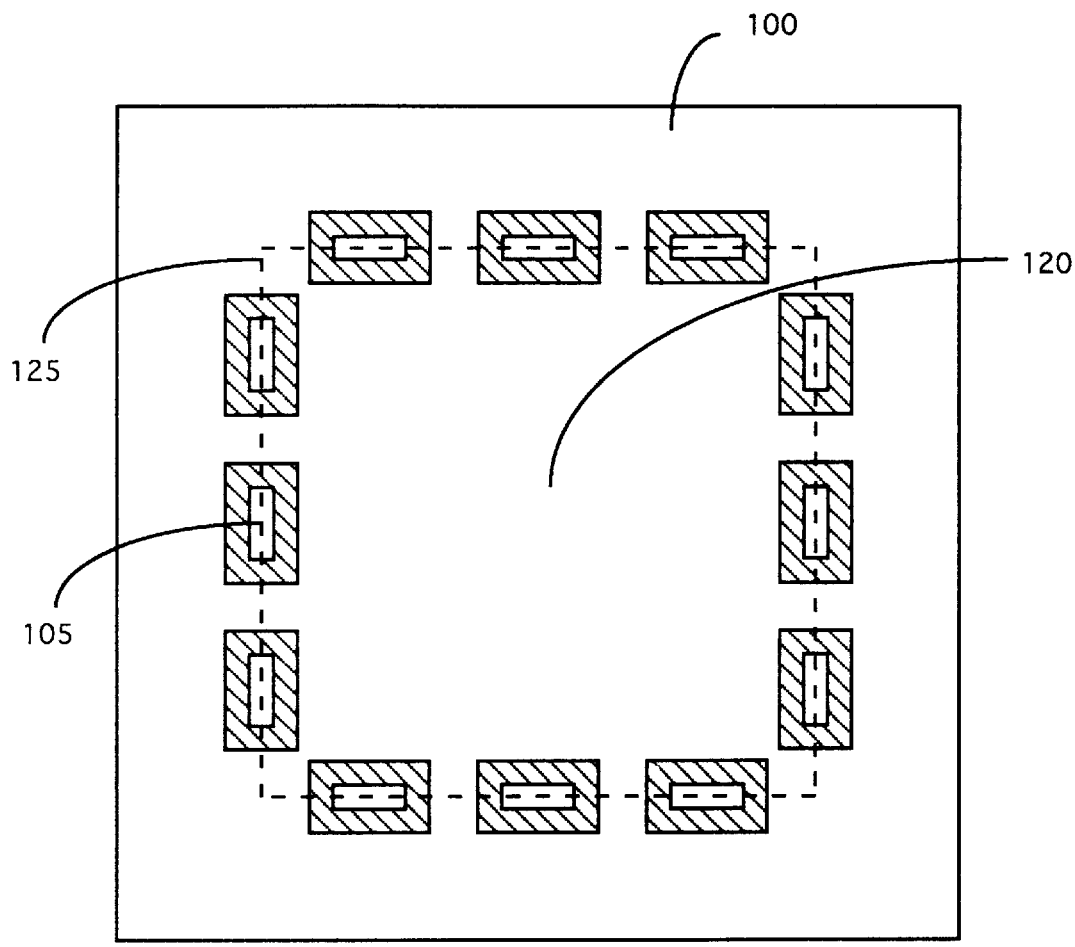
Figure 3D:
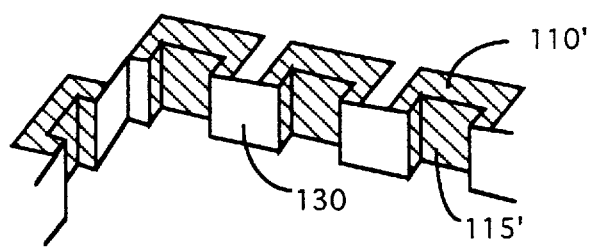

Please refer to FIGS. 3A to 3D for the processing steps utilized to manufacture a substrate which has a structure as that described in FIGS. 2A and 2B. Starting with FIG. 3A for a top view of a substrate 100 of the present invention which is composed preferably of a dielectric material which can be an organic or ceramic substrate. A plurality of rectangular cavities 105 are formed near the center portion of the substrate 100 wherein these cavities 105 form substantially a square ring surrounding the center portion of the substrate 100. For the purpose of forming a plurality of mutually insulated contact-pad segments (see detail description below), a metal plating or deposition step is carried out to deposit a layer of metal film on the top edge 110 and four side edge surfaces 115 of the rectangular cavities ( see FIG. 3B). The metal film can be film of copper, gold, nickel, or other types or combination of these conductive metals. The center portion of the substrate 120 is then cut off through a plane of cleavage 125 (FIG. 3C). A plurality of mutually insulated contact pad segments 110' are formed on the top surface of the substrate 100. The three remaining edge surfaces 115' which are plated with metal layer thus become a split wrap-around (SWA) connection for electrically connecting the mutually insulated contact pad segments 110' to the bottom surface (FIG. 3D). The contact pad segments 110' are mutually insulated since the exposed surfaces 130 along the plane of cleavage now separate each of the contact pad segments 110' and the SWA connections 115' from two neighboring segments and SWA connections.

Figure 4A:
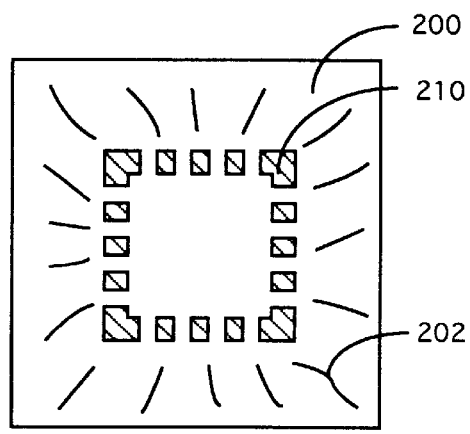
FIGS. 4A to 4D show alternate processing steps for manufacturing the substrate of the present invention.
Figure 4B:
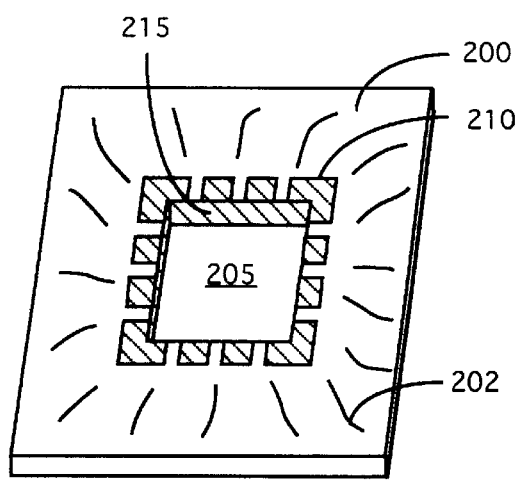
Figure 4C:
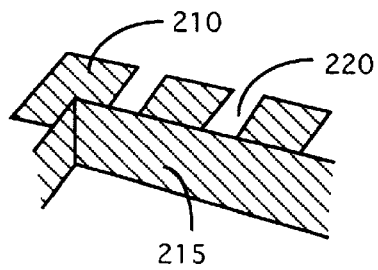
Figure 4D:
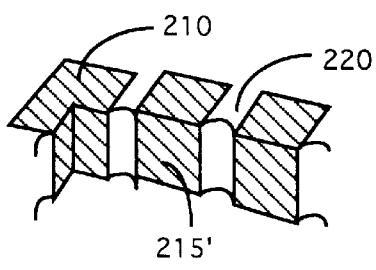

FIGS. 4A to 4D show an alternate method for making a single layer substrate 200 provided with mutually insulated contact-pad segments and SWA connections for electrical connection to the split planes coated on the bottom surface of the substrate 200. A metal plating or deposition process is carried out to deposit a patterned thin layer of metal film on the top surface with a plurality of mutually insulated contact-pad segments 210 along a central square or rectangular area. (FIG. 4A). These mutually insulated contact-pad segments 210 can be formed simultaneously with a plurality of metal traces 202 on the substrate. A central portion 205 of the substrate 200 surrounded by the mutually insulated contact-pad segments 210 is first cut off (FIG. 4B). A metal film is then coated on the entire edge surfaces 215 (FIG. 4C). The coated substrate 200 as shown in FIG. 4C is then placed in a laser micro machine to trim off metal coatings at prescribed intervals from the coated edge surfaces on the sides of the cut off section 220. A plurality of mutually insulated contact pad segments 210 and split-wrap-around (SWA) connections 215' along the side walls of the cut off section 205 are formed (FIG. 4D). Again, a plurality of split contact planes are then formed on the bottom surface on the substrate 200 similar to that shown in FIG. 3. Each of the contact pad segments 210' and the SWA connections 215' are in electrical contact with a corresponding contact plane on the bottom surface.

Figure 4E:
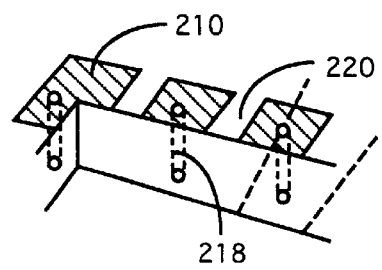
FIG. 4E shows a partial perspective view of a manufacture step in making a substrate as an alternate preferred embodiment with platted via connections according to the present invention.

A different embodiment is shown in FIG. 4E. Instead of forming the split-wrap-around (SWA) connections 215' as that shown in FIG. 4D, a through hole via is formed on each contact-pad segments 210 penetrating the substrate 200. A via connection 218 is formed in the surface area designated for each contact-pad segment 210. The contact pad segments 210 and the via connection 218 can be formed by carrying out a metal plating process such that the contact pads are in electrical contact with a split contact plane, e.g., contact plane 140 on the bottom surface of the substrate 200 as shown in FIG. 2C, through the via connection 218. The through hole via connection 218 and the SWA connections 215' can be implemented separately or in combination depending on various design considerations and requirements for the semiconductor device and the electronic package to be supported on the substrate 200 as disclosed in this invention.

Thus, the present invention discloses a substrate 200 including an area 205 for disposing a semiconductor device for packaging and electrically connecting to the semiconductor device. The substrate includes a plurality of mutually insulated contact segments 210 disposed immediately adjacent to the area 205 for disposing the semiconductor device on a first surface of the substrate. The substrate 200 further includes a plurality of mutually insulated contact planes 140, disposed on a second surface, opposite the first surface of the substrate. The substrate further includes a plurality of connection means 215' for electrically connecting each of the contact planes 140 on the second surface to a corresponding mutually insulated contact segment 210 disposed on the first surface.

Therefore, by the processing steps as described above, a two-sided single layer substrate is manufactured provided with contact pad segments which are mutually insulated and ready for a user to select for connection to either a ground or power plane coated on the bottom surface. The difficulties and limitations due to the structure complexity which causes more complicate and expensive manufacture processes are now resolved by the structure and manufacture method disclosed in this invention.

For a typical semiconductor device formed on a chip with a die size of approximately 12 mm by 14 mm which has about 320 signal wires and 100 power and ground wires, the mutually insulated contact-pad segment has a length of 0.5–1.2 mm and a width of 0.2 to 0.7 mm. The cut-off section, e.g., cut-off section 220, separating the contact-pad segments and the SWA connections, has a length of approximately 0.08 to 0.2 mm. The dimensions and shapes of these individual design elements can be flexibly arranged depending on the configuration of the semiconductor device and the corresponding package assembly intended for containing and protecting the semiconductor device. The benefits and advantages of employing this novel substrate and the packaging assembly are not limited in anyway by the size or configuration of the exemplary embodiments listed in this patent application which are only used for the purposes of describing and illustrating the invention.

Figure 5A:
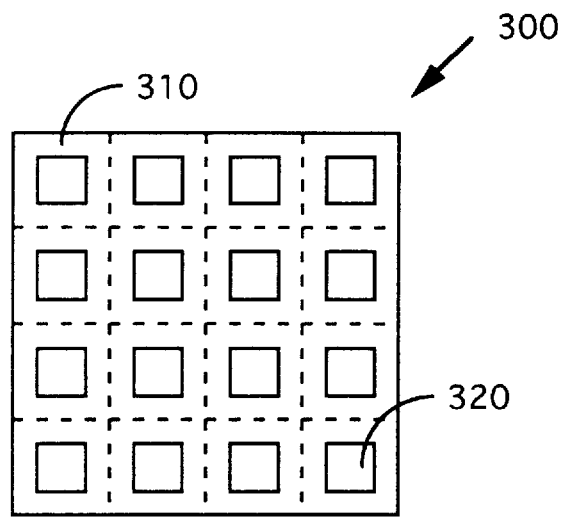
FIG. 5A shows a PCB sheet for manufacturing a plurality of substrates in parallel.
Figure 5B:
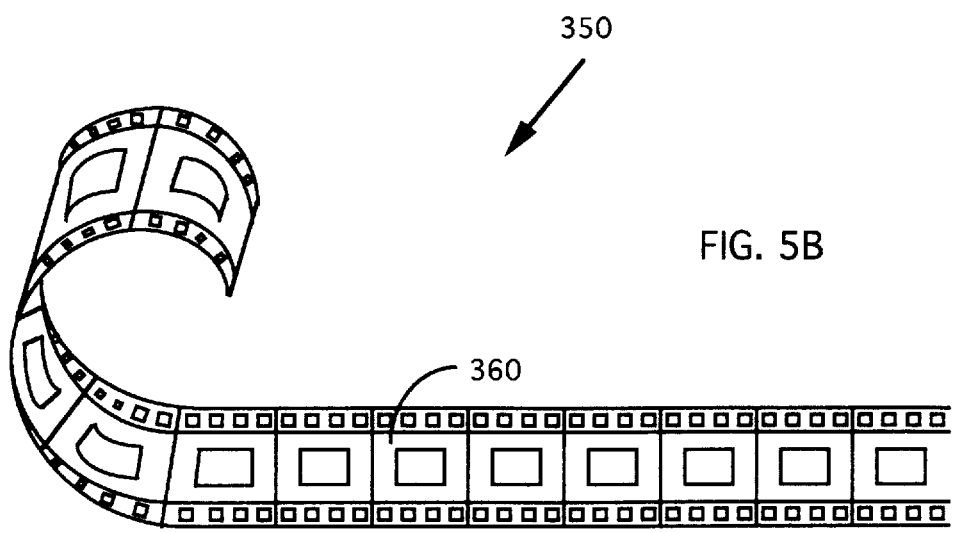
FIG. 5B shows a continuous flexible strip of PCB sheet for manufacturing several substrates in a streamline roll-to-roll process flow or in parallel to increase the productivity for producing the substrate of this invention.

Since the structure of the substrate is now simplified. A more streamline manufacture process can be performed to automate and mass produce the substrate described above. FIG. 5A shows a printed circuit board (PCB) sheet 300 which includes a plurality of substrate areas 310 wherein each substrate area has a central cut off section 320 for placement of a semiconductor chip therein. Each of these substrate areas 310 can be processed in parallel to manufacture a plurality of substrate of this invention simultaneously to increase the productivity. For a flexible type of PCB sheet, FIG. 5B shows a roll-shaped PCB strip 350 which includes a sequence of concatenated substrate area 360 which can be processed in a streamlined manner one after another or several of these substrate areas in parallel to produce the substrate simultaneously. FIG. 5C shows another strip 400 of concatenated substrates 410. The substrates 410 are composed of rigid PCB materials wherein a preferred embodiment of the substrate strip 400 which is similar to a 35-mm film strip. Again, the processing steps for manufacturing these substrates 410 can be carried out in streamline or in parallel depending on specific processing flows for making the substrate 410. FIG. 5D is a cross sectional view of an alternate substrate strip 450 with a structure which includes a heat-spreader layer 460. The heat-spreader layer 460 is attached to the bottom surface of each substrate 470 via an insulative bonding layer (not shown) which can be a layer composed of pre-preg or laminated pre-preg materials to securely attach the heat-spreader layer 460 to the substrate 470. The heat dissipation of a semiconductor device to be packaged by use of these substrates 470 can be enhanced with this additional heat-spreader layer 460. Because of the simple structure of the substrate as shown in FIGS. 5A to 5D above, these high productive manufacture techniques can be conveniently implemented to further reduce the production cost of the packaged semiconductor devices.

Referring to FIGS. 6A and 6B for an alternate preferred embodiment of the present invention which includes an substrate 500 and a through-hole connection means 515 of the present invention. The electrical routing is similar to that shown in FIGS. 2A and 2B. In stead of the split wrap around (SWA) connecting means 115' for connecting the mutually insulated contact pads 510 to the split contact planes 540, FIGS. 6A and 6B show that the connection is now provided with via connection means 515 which is a via filled with conductive material, e.g., copper or aluminum, in the via 515 connected between the contact pad segments 510 to the split contact planes 540. Similar to the first preferred embodiment, the substrate 500 is composed of a dielectric material, e.g., a ceramic or an organic dielectric substrate. The substrate 500 includes a central cut-off section 520 provided for placement of a semiconductor therein device (not shown). Along the top surface near the edges of the cut-off portion 520 are a segmented contact-ring which includes a plurality of mutually insulated contact-pad segments 510. The mutually insulated contact pad segments 510 are formed to surround the semiconductor chip wherein each of these mutually insulated contact-pad segments 510 is connected to a through-hole contact means 515 which is with a through hole punched through the substrate 500 to reach the bottom surface with conductive material filling the through hole 515 to provide for electric connection between the mutually insulated contact-pad segments 510 to a corresponding split plane 540 formed on the bottom surface. The mutually insulated contact-pad segments 510 and the through-hole contact means 515 are preferably formed with thin metal film and metallic filling of the through holes with copper, gold, silver or other types of conductive metals or combinations of these metals.

A new structure and method of manufacture a single-layer substrate provided with segmented contact ring and contact planes are disclosed in this invention such that the above difficulties and limitations encountered in the prior art can now be overcome. Specifically the present invention provides a new structure and method of manufacture for a single-layer substrate wherein a plurality of mutually insulated contact-segments for power and ground connections are provided with split contact planes disposed on the bottom surface of the single layer substrate whereby a single layer substrate can be utilized while still maintaining high performance characteristics which are achievable previously only through multiple layer substrate in the prior art. The single layer substrate includes split ground and power planes such that the structure complexities and the manufacture costs are reduced. A designer is provided with more flexibility of selecting number and locations of ground and power connections to the mutually insulated contact pad segments such that more optimal layout design and lower manufacture cost can be more conveniently achieved. Additionally, the insulation between the contact pads and wires is improved and by arranging alternating ground and power contact pads, lower noises caused by coupling and interference can be reduced.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A two-side single-layer substrate including a cavity for disposing a semiconductor device for packaging and electrically connecting to said semiconductor device, said substrate comprising:

a plurality of mutually insulated contact segments disposed on a first surface of said substrate configured as a single ring around edges of said cavity wherein said contract segments include power segments and ground segments for connecting to high and low voltage terminals respectively on said semiconductor;

a plurality of mutually insulated contact planes, disposed on a second surface, opposite said first surface of said substrate wherein said contact planes include co-planar power planes and ground planes corresponding to said power and ground segments; and a plurality of connection means comprising mutually insulated split-wrap-around (SWA) conductive strips wrapping around edges of said cavity for electrically connecting each of said co-planar power and ground contact planes on said second surface to a corresponding mutually insulated power and ground contact segment disposed on said first surface.

2. The substrate of claim 1 further comprising:

a plurality of signal conductive traces disposed in a gap between said co-planar power and ground contact planes on said second surface thus providing a plurality of co-planar signal traces for connecting to corresponding signal terminals on said semiconductor device.

3. The substrate of claim 1 wherein:

said connection means further includes a plurality of via-connection means penetrating said substrate extending from said first surface to said second surface of said substrate for connecting said mutually insulated power and ground contact segments configured as a single ring on said first surface around said cavity to said corresponding mutually insulated power and ground contact planes on said second surface.

4. A substrate including an area for disposing a semiconductor device for packaging and electrically connecting to said semiconductor device comprising:
   a plurality of mutually insulated contact segments disposed on a first surface of said substrate immediately adjacent to said area for disposing said semiconductor device;
   a plurality of mutually insulated contact planes, disposed on a second surface, opposite said first surface of said substrate;
   a plurality of connection means for electrically connecting each of said contact planes on said second surface to a corresponding mutually insulated contact segment disposed on said first surface;
   a plurality of signal contact pads disposed further away on said first surface than said mutually insulated contact segments from said area provided for disposing said semiconductor area;
   a plurality of metal traces disposed on said first surface each connected to said signal contact pads extending outwardly away from said area provided for disposing said semiconductor device; and
   a plurality of next-level contact means disposed on said first surface and each connected to one of said metal traces.

5. A substrate including an area for disposing a semiconductor device for packaging and electrically connecting to said semiconductor device comprising:
   a plurality of mutually insulated contact segments disposed on a first surface of said substrate immediately adjacent to said area for disposing said semiconductor device;
   a plurality of mutually insulated contact planes, disposed on a second surface, opposite said first surface of said substrate;
   a plurality of connection means for electrically connecting each of said contact planes on said second surface to a corresponding mutually insulated contact segment disposed on said first surface;
   a plurality of signal contact pads on said first surface disposed further away than said mutually insulated contact segments from said area provided for disposing said semiconductor area;
   a plurality of second surface metal traces each connected to one of said signal contact pads disposed on said first surface through a via-connection penetrating said substrate; and
   said mutually insulated contact planes disposed on said second surface having a gap between two adjacent contact planes and each of said second surface metal traces disposed in one of said gaps.

6. A substrate including an area for disposing a semiconductor device for packaging and electrically connecting to said semiconductor device comprising:
   a plurality of mutually insulated contact segments disposed on a first surface of said substrate immediately adjacent to said area for disposing said semiconductor device;
   a plurality of mutually insulated contact planes, disposed on a second surface, opposite said first surface of said substrate;
   a plurality of connection means for electrically connecting each of said contact planes on said second surface to a corresponding mutually insulated contact segment disposed on said first surface;
   said plurality of mutually insulated contact segments being a ring-shaped mutually insulated contact segments surrounding said area provided for disposing said semiconductor device.

7. The substrate of claim 6 wherein:
   said ring-shaped mutually insulated metallic contact segments surrounding said area provided for disposing said semiconductor device include mutually insulated metallic contact segments with a gap of approximately 0.05 to 0.3 millimeters between each of said mutually insulated segments.

8. A substrate including an area for disposing a semiconductor device for packaging and electrically connecting to said semiconductor device comprising:
   a plurality of mutually insulated contact segments disposed on a first surface of said substrate immediately adjacent to said area for disposing said semiconductor device;
   a plurality of mutually insulated contact planes, disposed on a second surface, opposite said first surface of said substrate;
   a plurality of connection means for electrically connecting each of said contact planes on said second surface to a corresponding mutually insulated contact segment disposed on said first surface;
   a plurality of next-level contact means disposed on said first surface; and
   a plurality of contact plane via-connection means penetrating from said second surface to said first surface for connecting each of said contact planes to one of said next-level connection means disposed on said first surface.

9. The substrate of claim 5 further comprising:
   a plurality of next-level contact means disposed on said first surface;
   a plurality of metal-trace via-connection means penetrating from said second surface to said first surface for connecting each of said second surface metal traces to said next-level connection means disposed on said first surface.

10. A substrate including an area for disposing a semiconductor device for packaging and electrically connecting to said semiconductor device comprising:
    a plurality of mutually insulated metallic contact segments disposed on a first surface of said substrate as a ring-shape immediately adjacent to and surrounding said area for disposing said semiconductor device wherein said mutually insulated metallic contact segments having a gap of approximately 0.05 to 0.3 millimeters between each of said segments;
    a plurality of mutually insulated contact planes, disposed on a second surface, opposite said first surface of said substrate wherein said mutually insulated contact planes having a gap between two adjacent contact planes;
    a cavity in said area for disposing said semiconductor device therein defining a plurality of edge surfaces extending from said first surface to said second surface;
    a plurality of next-level contact means disposed on said first surface;
    said plurality of connection means further includes a plurality of split conductive strips wrapping around said edge surfaces extending from said first surface to said second surface of said substrate for connecting said mutually insulated contact segments on said first surface to said corresponding split contact planes on said second surface;

a plurality of signal contact pads disposed further away on said first surface than said mutually insulated contact segments from said area for defining said area for disposing said semiconductor;

a plurality of metal traces disposed on said first surface each interconnecting said signal contact pads to said next level contact means, said metal traces extending outwardly away from said area provided for disposing said semiconductor device;

a plurality of second surface metal traces each connected to one of said signal contact pads disposed on said first surface through a via-connection penetrating said substrate and each of said second surface metal traces disposed in one of said gaps between said contact planes on said second surface;

a plurality of contact plane via-connection means penetrating from said second surface to said first surface for connecting each of said contact planes to one of said next-level connection means disposed on said first surface; and a plurality of metal-trace via-connection means penetrating from said second surface to said first surface for connecting each of said second surface metal traces to said next-level connection means disposed on said first surface.

11. A substrate including an area for disposing a semiconductor device for packaging and electrically connecting to said semiconductor device comprising:

a plurality of mutually insulated metallic contact segments disposed on a first surface of said substrate as a ring-shape immediately adjacent to and surrounding said area for disposing said semiconductor device wherein said mutually insulated metallic contact segments having a gap of approximately 0.05 to 0.3 milimeters between each of said segments;

a plurality of mutually insulated contact planes, disposed on a second surface, opposite said first surface of said substrate wherein said mutually insulated contact planes having a gap between two adjacent contact planes;

a plurality of next-level contact means disposed on said first surface;

said connection further includes a plurality of via-connection means penetrating said substrate extending from said first surface to said second surface of said substrate for connecting said mutually insulated contact segments on said first surface to said corresponding split contact planes on said second surface;

a plurality of signal contact pads disposed further away on said first surface than said mutually insulated contact segments from said area for defining said area for disposing said semiconductor;

a plurality of metal traces disposed on said first surface each interconnecting said signal contact pads to said next level contact means, said metal traces extending outwardly away from said area provided for disposing said semiconductor device;

a plurality of second surface metal traces each connected to one of said signal contact pads disposed on said first surface through a via-connection penetrating said substrate and each of said second surface metal traces disposed in one of said gaps between said contact planes on said second surface;

a plurality of contact plane via-connection means penetrating from said second surface to said first surface for connecting each of said contact planes to one of said next-level connection means disposed on said first surface; and a plurality of metal-trace via-connection means penetrating from said second surface to said first surface for connecting each of said second surface metal traces to said next-level connection means disposed on said first surface.

12. The substrate of claim 1 wherein:
said substrate is composed of laminate-glass epoxy.
13. The substrate of claim 1 wherein:
said substrate is composed of bismaleimide triazine (BT).
14. The substrate of claim 1 wherein:
said substrate is composed of polyimide.
15. The substrate of claim 1 wherein:
said substrate is composed of teflon.
16. The substrate of claim 1 wherein:
said substrate is composed of ceramic.
17. The substrate of claim 1 wherein:
said substrate is composed of aluminum oxide.
18. The substrate of claim 1 wherein:
said substrate is composed of aluminum nitride.
19. The substrate of claim 1 wherein:
said substrate is composed of beryllium oxide.

20. A two-side single-layer substrate including a cavity for disposing a semiconductor device for packaging and electrically connecting to said semiconductor device, said substrate comprising:

a plurality of mutually insulated contact segments disposed on a first surface of said substrate configured as a single ring around edges of said cavity wherein said contract segments include power segments and ground segments for connecting to high and low voltage terminals respectively on said semiconductor;

a plurality of mutually insulated contact planes, disposed on a second surface, opposite said first surface of said substrate wherein said contact planes include co-planar power planes and ground planes corresponding to said power and ground segments; and a split via connection (SVC) means penetrating said substrate extending from said first surface to said second surface of said substrate for connecting said mutually insulated power and ground contact segments configured as a single ring on said first surface around said cavity to said corresponding mutually insulated power and ground contact planes on said second surface.

21. The substrate of claim 20 further comprising:
a plurality of signal conductive traces disposed in a gap between said co-planar power and ground contact planes on said second surface thus providing a plurality of co-planar signal traces for connecting to corresponding signal terminals on said semiconductor device.

22. The substrate of claim 20 further comprising:
a plurality of micro-strips ($\mu$-strips) disposed on said first surface, each of said micro-strips connected to a signal terminal on said IC device.

* * * * *